(12) United States Patent
Fisher et al.

(10) Patent No.: US 7,767,508 B2
(45) Date of Patent: Aug. 3, 2010

(54) METHOD FOR FORMING OFFSET SPACERS FOR SEMICONDUCTOR DEVICE ARRANGEMENTS

(75) Inventors: Philip A. Fisher, Fishkill, NY (US); Laura A. Brown, Pleasant Valley, NY (US); Johannes Groschopf, Wainsdorf (DE); Huicai Zhong, Wappingers Falls, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 87 days.

(21) Appl. No.: 11/580,952

(22) Filed: Oct. 16, 2006

(65) Prior Publication Data

US 2008/0090368 A1 Apr. 17, 2008

(51) Int. Cl.
*H01L 21/338* (2006.01)

(52) U.S. Cl. .......... 438/179; 438/230; 438/286; 438/303; 257/E21.626; 257/E21.64

(58) Field of Classification Search .......... 438/159, 438/179, 182, 185, 348, 366, 443, 555; 257/E21.207, 257/E21.221
See application file for complete search history.

(56) References Cited

U.S. PATENT DOCUMENTS

| | | | |
|---|---|---|---|
| 5,679,592 A * | 10/1997 | Kang | 438/286 |
| 5,909,622 A * | 6/1999 | Kadosh et al. | 438/286 |
| 6,087,266 A | 7/2000 | Abraham | |
| 6,548,413 B1 | 4/2003 | Ho et al. | |
| 6,684,382 B2 | 1/2004 | Liu | |
| 6,696,334 B1 | 2/2004 | Hellig et al. | |
| 6,777,283 B2 * | 8/2004 | Maeda | 438/231 |
| 2003/0035884 A1 | 2/2003 | Gluschenkov et al. | |
| 2004/0048472 A1 * | 3/2004 | Wieczorek et al. | 438/689 |

* cited by examiner

*Primary Examiner*—Charles D Garber
*Assistant Examiner*—Cheung Lee
(74) *Attorney, Agent, or Firm*—Volpe and Koenig, P.C.

(57) ABSTRACT

Methods are provided for the fabrication of abrupt and tunable offset spacers for improved transistor short channel control. The methods include the formation of a gate electrode within a dielectric layer, with only a top portion of the gate electrode exposed. Silicon is added on the top portion of the gate electrode, by selective epitaxial growth, for example. Etching of the dielectric layer is performed with added silicon at the top portion of the gate electrode serving as a silicon mask to prevent etching of the dielectric layer directly underneath the silicon mask, which includes overhangs over the gate electrode sidewalls. The etching creates offset spacers in a production-worthy manner, and can be used to form offset spacers that are asymmetrical in width. By running the methodology in a microloading regime, wider offset spacers may be created on narrower polysilicon gate features, thereby improving Vt roll-off.

13 Claims, 3 Drawing Sheets ly-higher-density area. In conventional offset spacer fabrication techniques, the same size offset spacers are produced where the critical dimension (CD) of features are provided as well as for those features where CD is greater. In other words, the same size offset spacers are employed regardless of the CD of the polysilicon feature. Creating wider offset spacers for the polysilicon features with a smaller CD would result in improved less rapid reduction of threshold voltage at smaller gate lengths, i.e. it would alleviate the short-channel effect commonly referred to as Vt roll-off. In other words, the contribution of across chip line width variation (ACLV) to Vt roll-off and chip quiescent current (IDDQ) would be reduced.

METHOD FOR FORMING OFFSET SPACERS FOR SEMICONDUCTOR DEVICE ARRANGEMENTS

FIELD OF THE INVENTION

The present invention relates to semiconductor manufacture, and more particularly, to a method for forming offset spacers during the semiconductor manufacturing process.

BACKGROUND OF THE INVENTION

One of the main technologies for ultra large-scale integrated (ULSI) circuits is complementary metal-oxide-semiconductor (CMOS) technology. High-performance CMOS technologies commonly employ various processes to form offset spacers, sidewall spacers, and silicide. Offset spacers are used to place shallow source/drain extensions and/or halo implants a specific distance from a gate edge. Offset spacers have been used for several other types of implant processes, such as xenon pre-amorphization implants, for example. Typically, offset spacers consist of silicon oxide or silicon nitride.

The width of offset spacers has been varied to adjust the channel lengths of the P-channel MOS (PMOS) and N-channel MOS (NMOS), as well as to reduce the overlap capacitance, known as the Miller capacitance, between the gate electrode and the source/drain region. While increasing the widths of the offset spacers decreases the overlap between the source/drain extensions and the gate, thus reducing the Miller capacitance and improving device performance, if the offset spacers are too wide, a condition referred to as "under-lap" occurs. With under-lap, the source/drain extensions no longer reach the gate and device performance degrades. Conversely, if the offset spacers are narrower than expected, excessive direct overlap will reduce the metallurgical channel length, resulting in degraded gate control of the channel and thus reduced Vt, degrading the phenomenon commonly referred to as "Vt roll-off." Hence, it is important to precisely control the width of the offset spacers during device manufacturing.

CMOS technologies regularly employ both NMOS and PMOS transistors within the same overall device. The PMOS and NMOS transistors utilize different dopant materials for source/drain and source/drain-extension implantation. During the thermal annealing required for dopant activation, the dopant, such as boron, used in the P-type implanted source/drain extension areas diffuses much more than the larger arsenic atoms employed in the extension areas of the NMOS transistors. As a result, the PMOS source/drain extension areas will have a larger overlap with the PMOS gates than will be the case with source/drain extensions and NMOS gates. When the width of the offset spacers are the same, the faster diffusion of the boron atoms creates problems in preventing a large overlap in the source/drain extension areas of the PMOS transistor, and for preventing under-lap in the source/drain extension areas of the NMOS transistors. This necessitates the use of lower doses PMOS transistors in source-drain extensions compared to those in NMOS transistors. For example, it is not at all uncommon for the extension dose of a PMOS transistor to be half of that in an NMOS. The reduced dose results in increased series resistance and reduced drive current, an inherent trade-off with different optimal points for NMOS and PMOS respectively. To overcome this problem, differential widths for the offset spacers of the NMOS devices and PMOS devices have been provided. There is a need for forming offset spacers in a production-worthy manner that is also able to form differential width offset spacers.

Among the steps employed for manufacturing semiconductor processes are etching and deposition. A number of different etching technologies and methods available, including plasma etching and several types of ion beam etching. In certain instances, over etching, e.g., etching for an extended period of time compared to the normal etching period, has been used to reduce feature sizes. However, over etching creates a microloading effect. Maintaining uniformity is of particular importance during etching processes. Uniformity refers to the evenness of etching for critical dimension, as well as uniformity of etching across a wafer and from wafer to wafer. At the microscopic level, etching rates and profiles depend on feature sizes and feature separation. Microscopic uniformity problems can be grouped into several categories including pattern-dependent etch effects, generally referred to as microloading. More specifically, microloading refers to the dependence of the etch rate on feature separation for identically sized features and results from the depletion of reactants when the wafer has a local

SUMMARY OF THE INVENTION

These and other needs are met by embodiments of the present invention which provide a method of forming offset spacers, comprising the steps of forming a gate electrode partially within a dielectric layer, with only a top portion of the gate electrode exposed. Silicon is added on the top portion of the gate electrode. The dielectric layer is anisotropically etched with the added silicon forming an offset spacer mask to thereby form offset spacers on the gate electrode under the offset spacer mask.

The earlier stated needs are also met by other aspects of the present invention which provide a method of forming a semiconductor arrangement comprising the steps of forming a silicon mask at the top of a gate electrode on a substrate, this silicon mask covering side portions that overhang sidewalls of the gate electrode. A dielectric layer is etched on the substrate, the silicon mask preventing etching of the dielectric layer under the silicon mask side portions. Offset spacers are thereby formed from the dielectric layer.

The earlier stated needs are also met by still further aspects of the present invention which provide a method of forming offset spacers, comprising the steps of forming gate electrodes of a first width and gate electrodes of a second width different from the first width. The offset spacers are formed on the gate electrodes in a microloading regime. Offset spacers of the first width are formed on the first gate electrodes and offset spacers of a second width are formed on the second width gate electrodes.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the formation of offset spacers and differential offset spacers by production-worthy methods, as well providing for offset spacers of different width for features having different CDs on the same wafer. This is achieved, at least in part, by the present invention which provides for exposing the top portion of a gate electrode from a dielectric layer. A selective epitaxial growth process is performed to create a silicon mask at the top of the gate electrode. The silicon mask overhangs the sidewalls of the gate electrode. Anisotropic etching is performed, the overhang of the silicon mask serving to mask the dielectric layer directly underneath the overhang. The protected portion of the dielectric layer forms the offset spacers on the sidewalls of the gate electrode. The invention also allows for forming differential offset spacers by the use of a blocking dielectric layer. In certain embodiments, the offset spacer deposition or etching is run in a strong microloading regime in order to provide wider offset spacers where the polysilicon CD is smaller, thereby resulting in improved Vt roll-off.

Figure 1:
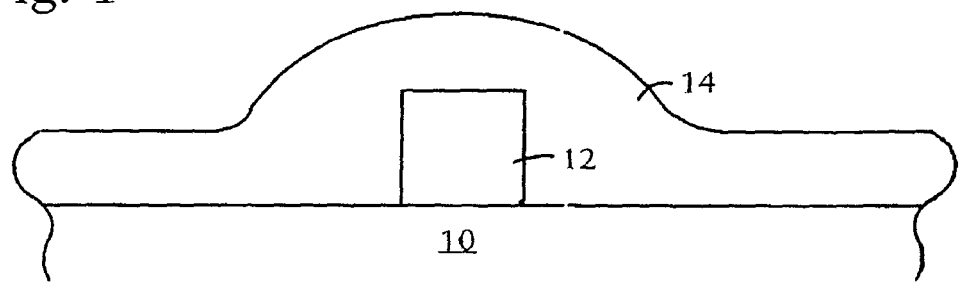
FIG. 1 is a schematic depiction of a cross-section of a semiconductor wafer during one phase of manufacturing in accordance with embodiments of the present invention.

FIG. 1 is a schematic depiction of a cross-section of a portion of a semiconductor wafer during one phase of manufacture in accordance with embodiments of the present invention. A substrate 10, which may be a bulk silicon substrate, or silicon-on-insulator (SOI), strained silicon, etc., is provided. A silicon or polysilicon gate electrode 12 that is formed by conventional techniques such as deposition of a polysilicon layer and etching of the layer, is provided on the substrate 10. A dielectric layer 14 is deposited by conventional blanket deposition, for example, over the substrate 10 and the gate electrode 12. Dielectric layer 14 is made of material that will ultimately form the offset spacers. Hence, the dielectric layer 14 should be made of a material suitable for use as offset spacers, such as silicon oxide, silicon nitride, etc.

Figure 2:
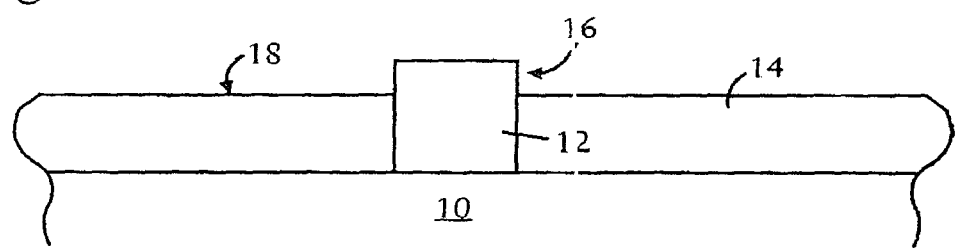
FIG. 2 shows the structure of FIG. 1 following planarization to expose the top portion of the gate electrode in accordance with embodiments of the present invention.

FIG. 2 shows the structure of FIG. 1 following a planarization that exposes the top portion 16 of the gate electrode 12. Planarization removes some of the dielectric layer 14 and creates a top surface 18 that is below the level of the polysilicon gate electrode 12. Planarization may be performed by a conventional technique, such as chemical mechanical polishing, for example.

Figure 3:
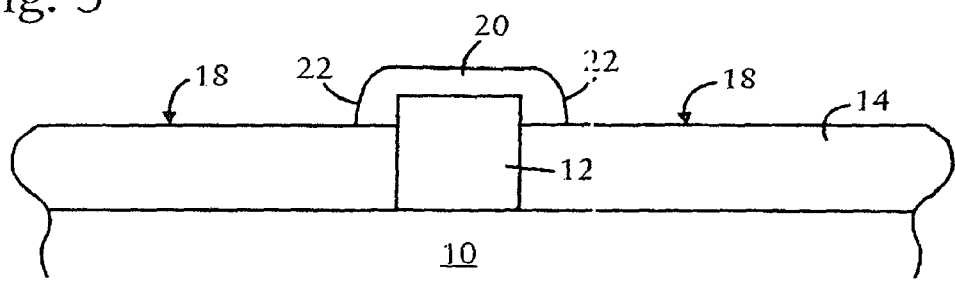
FIG. 3 depicts the structure of FIG. 2 after silicon is grown at the top portion of the gate electrode in accordance with embodiments of the present invention.

Silicon is added, as depicted in FIG. 3, at the top portion of 16 of the gate electrode 12. The added silicon forms a silicon mask 20, as will become more apparent. In certain embodiments of the invention, the silicon mask 20 is formed by a selective epitaxial growth process by which silicon is grown at the top portion 16 of the gate electrode 12. It is assumed that the selective epitaxial growth of the silicon 20 creates symmetrical width overhangs 22 on each side of the gate electrode 12. A conventional selective epitaxial growth process may be performed to create the silicon mask 20.

Figure 4:
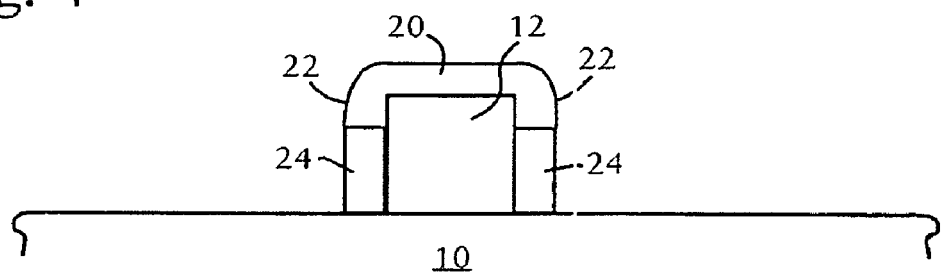
FIG. 4 shows the structure of FIG. 3 following etching to create offset spacers in accordance with embodiments of the present invention.

After the silicon mask 20 has been created, an etching process is performed to create offset spacers 24 from the dielectric layer 14, as depicted in FIG. 4. The etch may be an anisotropic etch, for example, such as a reactive ion etch. A suitable etch chemistry is selected depending upon the material in the dielectric layer 14. For example, the etch chemistry should be such that only dielectric layer 14 is etched anisotropically, and the silicon of the silicon mask 20 or the substrate 10 is not substantially etched.

The offset spacers 24 are therefore created as depicted in FIG. 4, in a production-worthy manner with a precisely defined width. Further processing in accordance with conventional device processing techniques may now be performed.

Figure 5:
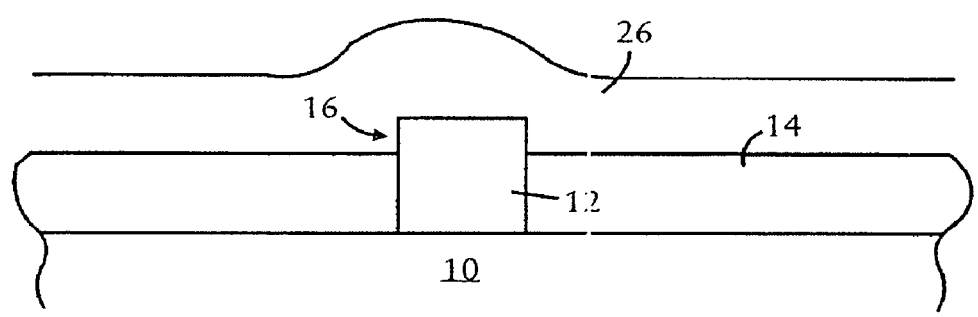
FIG. 5 depicts the structure of FIG. 3 following the deposition of a blocking dielectric layer in accordance with other embodiments of the present invention.

There are certain instances in which it is desirable to create offset spacers of different width, i.e., having asymmetrical widths. An embodiment of the method of the present invention that produces asymmetrical width offset spacers is depicted in FIGS. 5-8. In FIG. 5, which follows FIG. 3 in the process flow in this embodiment, a blocking dielectric layer 26 is formed by blanket deposition over the top portion 16 of the gate electrode 12 and the top surface 18 of the dielectric layer 14. Blocking dielectric layer 26 is preferably made of material different from material in dielectric layer 14 so as to allow for precise control of etching and stopping at the top surface 18 of the dielectric layer 14, as will be appreciated. However, it is also possible for the blocking dielectric layer 26 to made of the same material as dielectric layer 14 by precisely controlling the etch time to stop the etch at the top surface 18 of the dielectric layer 14, or by monitoring the thickness during the etch with an in-situ optical interferometric technique where this metrology is integrated into the hardware of the etch too.

Figure 6:
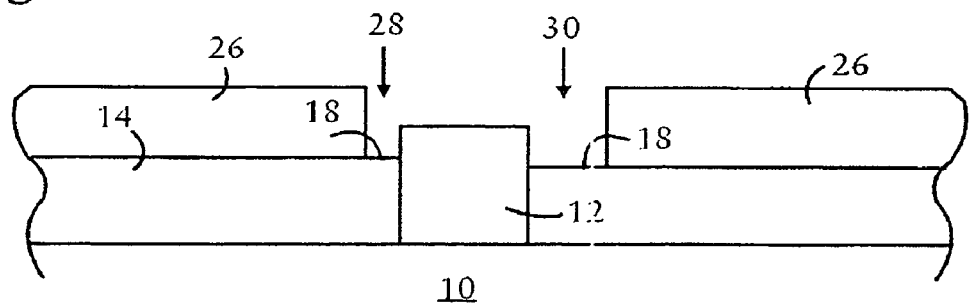
FIG. 6 shows the structure of FIG. 5 following the patterning of an offset and etching of the blocking dielectric layer in accordance with embodiments with the present invention.

Patterning and etching of the blocking dielectric layer 26 is now performed in accordance with embodiments of the present invention. The results of the patterning and etching is depicted in FIG. 6. As can be seen, the patterning is made with an offset with respect to the top portion 16 of the gate electrode 12. Hence, a first side portion 28 of the top surface portion 18 of the dielectric layer 14 that is exposed has a different width than a second side portion 30 of the top surface portion 18 of the dielectric layer 14 on the second side of the top portion 16 of the gate electrode 12. In the illustrated embodiment, the second side portion 30 is wider than the first side portion 28.

The masking and patterning can be any given width, such that certain devices may have asymmetrical offset spacers, while other devices may have symmetrical offset spacers. Furthermore, certain devices may be provided with wider offset spacers by this method, while other devices on the same wafer may be provided with narrower offset spacers.

Figure 7:
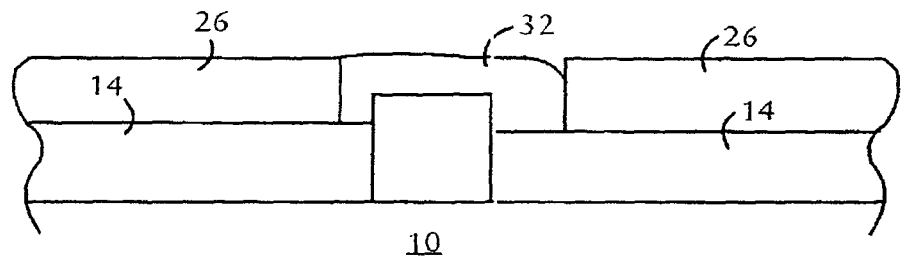
FIG. 7 shows the structure of FIG. 6 after silicon is grown on the top portion of the gate electrode in accordance with embodiments of the present invention.

In FIG. 7, silicon is added to form a silicon mask 32. In this case, the silicon mask 32 is off-centered with respect to the gate electrode 12.

Figure 8:
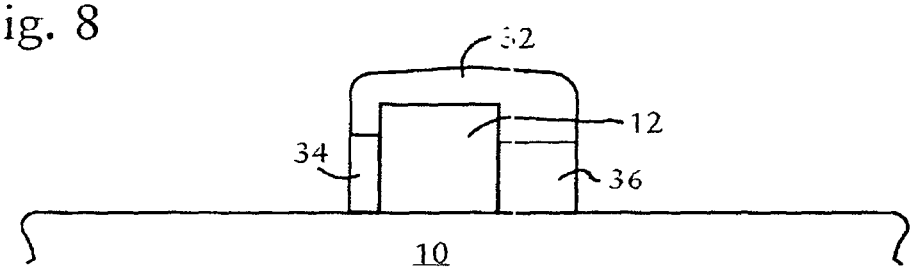
FIG. 8 depicts the structure of FIG. 7 following the removal of the blocking dielectric layer and etching of the dielectric layer to form differential offset spacers in accordance with embodiments of the present invention.

In FIG. 8, an anisotropic etch is performed in the same manner as depicted earlier with respect to FIG. 4. In this embodiment, the blocking dielectric layer 26 that formed a mask is first removed by an appropriate etching technique, and the dielectric layer 14 is then etched in the manner described-earlier. The etching creates asymmetrical offset spacers 34, 36, as defined by the overhang of the silicon mask 32. With the asymmetrical offset spacers 34, 36 now created, further processing of the device may occur in the normal process flow.

Figure 9:
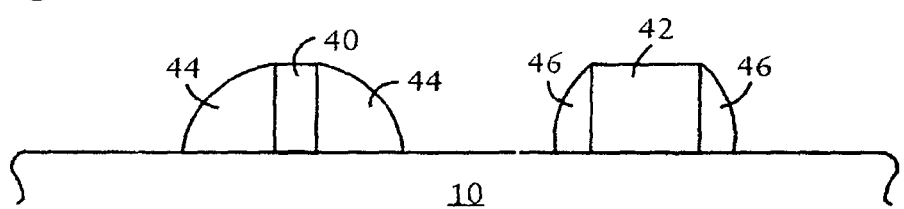
FIG. 9 depicts another embodiment of the present invention in which offset spacers of different widths are created in a microloading regime in accordance with embodiments of the present invention.

In certain instances, it is desirable to provide wider offset spacers on smaller gates, and thereby reduce the contribution of across chip line width variation (ACLV) to Vt roll-off and chip IDDQ. The present invention provides this by utilizing strong microloading in the deposition, etch, or selective epitaxial growth processes to create the wider offset spacers, as depicted in FIG. 9, on smaller gates. Narrower offset spacers may be formed on the wider gates. Microloading refers to the measure of difference in etch rate for large and small sized features. As seen in FIG. 9, a gate electrode 40 having a first width is provided on the same substrate as a gate electrode 42 having a second width that is wider than the first width. When run in a strong microloading regime, the offset spacers 44 that are created at the first width gate electrode 40 have a first width that is wider than the second offset spacers created at the second width gate electrodes 42. The offset spacers may be created by utilizing strong microloading during the deposition, etch or selective epitaxial growth processes to create the wider offset spacers on the smaller gates and the narrow offset spacers on the wider gates.

Although the present invention has been described and illustrated in detail, it is to be clearly understood that the same is by way of illustration and example only, and is not to be taken by of limitation, the scope of the present invention being limited only by the terms of the appended claims.

What is claimed is:

1. A method of forming offset spacers, comprising the steps of:
   forming a gate electrode partially within a dielectric layer, with only a top portion of the gate electrode exposed;
   adding silicon on the top portion of the gate electrode; and
   anisotropically etching the dielectric layer with the added silicon forming an offset spacer mask to thereby form offset spacers on the gate electrode under the offset spacer mask,
   wherein the offset spacers on opposite sidewalls of the gate electrode are asymmetrical in width.

2. The method of claim 1, wherein the step of forming a gate electrode partially within a dielectric layer includes: forming the gate electrode on a substrate; depositing the dielectric layer over the gate electrode and the substrate; and removing a portion of the dielectric layer to expose the top portion of the gate electrode.

3. The method of claim 2, wherein the step of adding silicon includes selective epitaxial growth of silicon on the top portion of the gate electrode.

4. The method of claim 3, wherein the step of removing a portion of the dielectric layer includes chemical mechanical polishing the dielectric layer.

5. The method of claim 1, further comprising forming a mask on the dielectric layer after the removal of a portion of the dielectric layer, the mask exposing the top portion of the gate electrode and a portion of a top surface of the dielectric layer.

6. The method of claim 5, wherein the exposed top surface portion of the dielectric layer includes a first side portion on a first side of the top portion of the gate electrode and a second side portion on a second side of the top portion of the gate electrode, wherein the first and second side portions of the top surface portion of the dielectric layer have different widths.

7. The method of claim 6, wherein the step of selective epitaxial growth of silicon includes forming added silicon of asymmetrical widths on the first and second side portions of the top surface of the dielectric layer.

8. The method of claim 7, wherein the step of forming a mask on the dielectric layer includes depositing a blocking dielectric layer on the dielectric layer and etching are opening in the blocking dielectric layer in accordance with a pattern to expose the top portion of the gate electrode and the portion of the top surface of the dielectric layer.

9. A method of forming a semiconductor arrangement comprising the steps:
   forming a silicon mask at the top of a gate electrode on a substrate, the silicon mask having side portions that overhang sidewalls of the gate electrode; and
   etching a dielectric layer on the substrate, the silicon mask preventing etching of the dielectric layer under the silicon mask side portions and thereby form offset spacers from the dielectric layer,
   wherein the silicon mask is off-centered with respect to the gate electrode such that the offset spacers formed are asymmetrical in width.

10. The method of claim 9, wherein the silicon mask is formed by selective epitaxial growth of silicon on the gate electrode.

11. The method of claim 10, further comprising forming the dielectric layer on the gate electrode and planarizing the dielectric layer until a top portion of the gate electrode is exposed prior to the selective epitaxial growth.

12. The method of claim 11, wherein the etching is an anisotropic etching.

13. The method of claim 9, further comprising forming a mask on the dielectric layer that exposes the top portion of the gate electrode and asymmetrically wide portions of a top surface of the dielectric layer prior to the selective epitaxial growth.

* * * * *